United States Patent [19]
Mortensen et al.

[11] 4,112,381
[45] Sep. 5, 1978

[54] PEAK DETECTOR

[75] Inventors: Alan Craig Mortensen; Scott A. DeHart, both of Loveland, Colo.

[73] Assignee: Hewlett-Packard Company, Palo Alto, Calif.

[21] Appl. No.: 794,862

[22] Filed: May 9, 1977

Related U.S. Application Data

[63] Continuation of Ser. No. 607,726, Aug. 25, 1975, abandoned.

[51] Int. Cl.² ............................................. H03K 5/153
[52] U.S. Cl. ..................................... 328/150; 307/232; 307/351; 307/358; 328/109
[58] Field of Search ............... 307/232, 351, 354, 358, 307/355, 359; 328/109, 110, 115–117, 150, 151, 146, 147

[56] References Cited
U.S. PATENT DOCUMENTS

| 3,372,234 | 3/1968 | Bowsher et al. | 307/358 |
| 3,502,993 | 3/1970 | Schürzinger et al. | 307/358 |
| 3,530,385 | 9/1970 | Smith et al. | 328/116 |
| 3,867,702 | 2/1975 | Torpie et al. | 307/351 |

*Primary Examiner*—John Zazworsky
*Attorney, Agent, or Firm*—William E. Hein

[57] ABSTRACT

A peak detector employing an integrator, a D.C. tracking circuit and a zero-crossing detection circuit produces a logic signal indicating the occurrence of a peak of an input voltage signal. Hysteresis in the zero-crossing detection circuit and integration of the input voltage signal improves the noise rejection of the peak detector.

2 Claims, 4 Drawing Figures

PEAK DETECTOR

CROSS REFERENCE TO RELATED APPLICATION

This is a continuation of application Ser. No. 607,726, filed Aug. 25, 1975, and now abandoned.

This application is related to a portion of the subject matter of copending U.S. patent application Ser. No. 597,957 entitled PROGRAMMABLE CALCULATOR, filed on July 21, 1975, by Bradley W. Miller et al, and assigned to the same assignee as the present application.

BACKGROUND AND SUMMARY OF THE INVENTION

This invention pertains generally to detection of peaks of an input voltage signal, and more specifically to a means of providing a logic signal which accurately indicates the occurrence of a peak of the input signal, while ignoring peaks of noise accompanying the input signal.

Detection of voltage signal peaks is frequently accomplished by transforming peaks of the input signal into zero crossings of signals within a peak detector, and by then sensing the occurrence of these resultant zero crossings. The transformation of input signal peaks into zero crossings is typically accomplished by applying a 90° phase shift to the input signal using integration or differentiation. Noise rejection is often accomplished by the use of threshold detection, but threshold detection becomes difficult in a system such as a magnetic tape reading circuit where the input signal level and the noise level both change with changes in the speed of the magnetic tape. In order to assure continued rejection of noise while still detecting input signal peaks when such a change in tape speed occurs, prior art threshold detection circuits have required complex circuitry to set the threshold of detection to a new level.

Peak detectors constructed according to the prior art have generally been susceptible to noise consisting of transient voltage spikes, such as might occur when switching logic is located in close physical proximity to such a peak detection circuit. The amplitude of the spikes is often comparable to the amplitude of the signal peaks that must be detected, thus making detection very difficult. Integration can be used to substantially reduce the effect of these spikes, since, even though the amplitude is large, the integrated value of the transient over time is small due to the brief duration of the transient. Integrators, however, produce a slowly varying D.C. component as part of their output waveforms. Prior art peak detectors which merely compare the integrator output signal to a fixed ground or reference level are disadvantageous in that they are susceptible to detection errors caused by this slowly varying D.C. component. Such errors may arise because some peaks may not be detected at all if the slowly varying D.C. component is sufficiently large. Additional errors may result because this slowly varying D.C. component causes some peaks to be detected either earlier or later in time than their actual time of occurrence. These latter errors are unacceptable in those situations sensitive to the time of occurrence of a peak.

To improve noise rejection, many peak detector circuits which detect zero crossings corresponding to peaks of the input signal have been arranged to introduce hysteresis within an associated comparison circuit so that, for example, a positive-going zero crossing activates a comparator only when the signal being detected reaches a certain positive level, and a negative-going zero crossing activates a comparator only when the signal being detected reaches a certain negative level. This hysteresis reduces the likelihood of indicating multiple peaks caused by noise on the signal at the detection point. In addition, the use of a non-zero detection point created by hysteresis reduces the possibility that mere noise will activate the comparison circuit. Prior art peak detectors have required either two comparators or a single comparator in combination with a rectifier to achieve hysteresis in the comparison circuit, thus resulting in more complex circuitry.

It is therefore an object of this invention to provide a simplified circuit to detect the occurrence of peaks of an input voltage signal. It is a further object of this invention to provide such a peak detector circuit having a high degree of noise immunity, including immunity from noise consisting of transient voltage spikes of amplitude comparable to the peak amplitude of the input voltage signal. These objects are accomplished in accordance with the preferred embodiment of the invention by employing an integrator, a D.C. tracking circuit, and a zero-crossing detection circuit using only a single comparator.

The integrator simultaneously filters both low and high frequency noise appearing on the input signal, and reduces the effect of transient voltage spikes by integrating them with respect to time. The integrator circuit also applies a 90° phase shift to the input signal to create a zero crossing at the integrator output which is coincident with a peak of the input signal. The signal level of the integrator output remains relatively constant even when the amplitude of the input signal changes due to a change in speed of a magnetic tape containing information in the form of flux reversals on the tape, for example.

The D.C. level, as well as any low frequency noise, present at the integrator output is sampled and dynamically updated by the D.C. tracking circuit to provide a reference level that allows a more accurate determination of the point at which a zero crossing of the integrator output, corresponding to a peak of the input signal, occurs.

The point at which the zero crossing occurs is sensed by the zero-crossing detection circuit, which compares the integrator output signal to the D.C. level detected by the D.C. tracking circuit. The zero-crossing detection circuit produces a logic level transition at its output to indicate detection of a peak of the input signal. Noise immunity of the peak detector circuit may be improved by employing a single comparator and positive feedback within the zero-crossing detection circuit to introduce hysteresis.

DESCRIPTION OF THE PREFERRED EMBODIMENT

Figure 1:
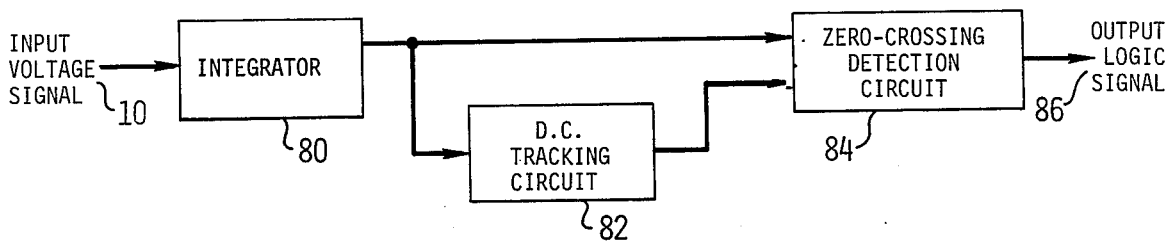
FIG. 1 is a block diagram of a peak detector employing an integrator, a D.C. tracking circuit, and a zero-crossing detection circuit, in accordance with the preferred embodiment of the invention.

Referring now to FIG. 1, there is shown a block diagram of a peak detector which provides a rising or falling edge at its output that is coincident with the voltage peaks of an applied input signal. The basic blocks of the peak detector, described in detail herein, are an integrator 80, a D.C. tracking circuit 82, and a zero-crossing detection circuit 84. An input signal 10 is applied to the integrator 80 to produce a signal at the integrator output that is proportional to the value of the input signal 10 integrated with respect to time. The integrator 80 introduces a −90° phase shift to its output signal with respect to the input signal 10 and additionally acts as a bandpass filter to attenuate low frequency and high frequency noise accompanying the input signal 10. The output of the integrator 80 is connected directly to an input of the zero-crossing detection circuit 84. The output of the integrator 80 is also applied to the D.C. tracking circuit 82. The D.C. tracking circuit 82 tracks the D.C. component and any low frequency noise component of the integrator output signal and provides an output level related to these components. The D.C. tracking circuit output is applied to another input of the zero-crossing detection circuit 84 to provide a reference level that allows a comparator within the zero-crossing detection circuit 84 to determine the zero crossing point of the integrator output signal. Due to the previously described −90° phase shift through the integrator 80, the zero crossing detected by the zero-crossing detection circuit 84 corresponds to the occurrence of a peak of the input signal 10. An output logic signal 86 from the zero-crossing detection circuit 84 makes a transition from zero to +4.5 volts as the integrator output signal becomes relatively more negative than the D.C. level generated by the D.C. tracking circuit 82. The output logic signal 86 makes a transition from +4.5 volts to zero volts as the integrator output signal becomes relatively more positive than the D.C. level generated by the D.C. tracking circuit 82. A logic signal that is complementary to the output logic signal 86 is available within the zero-crossing detection circuit 84.

Figure 2:
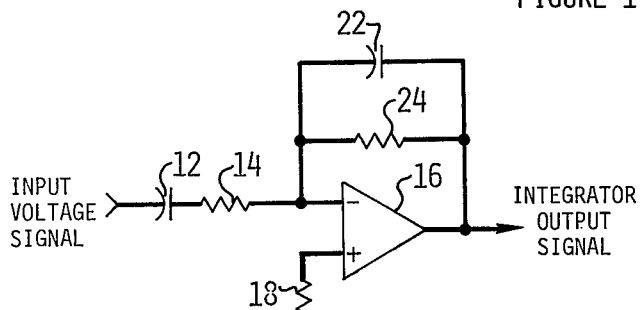
FIG. 2 is a detailed schematic diagram of the integrator of FIG. 1.

Referring now to FIG. 2, there is shown a detailed schematic diagram of the integrator 80 of FIG. 1. The input signal 10 is applied to a capacitor 12 which is connected in series to a resistor 14. Resistor 14 is in turn connected to the inverting input of an operational amplifier 16. A capacitor 22 and a resistor 24 are connected in parallel between the inverting input and the output of the operational amplifier 16. The non-inverting input of the operational amplifier 16 is connected through a resistor 18 to a ground reference 20.

Capacitor 12, in conjunction with resistor 14, attenuates low frequency noise. Capacitor 12 also prevents any D.C. component of the input signal 10 from appearing at the input to operational amplifier 16.

Resistor 14, capacitor 22, and operational amplifier 16 effect the integration of input signal 10. Resistor 24 causes capacitor 22 to gradually discharge so that offset voltages in amplifier 16 will not cause a large D.C. voltage component to accumulate at the integrator output. The time constant determined by resistor 24 and capacitor 22 should be relatively long compared to the maximum period of the input signal 10 to assure that integration of the input signal occurs.

The signal at the output of amplifier 16 is proportional to the integral of the input signal with respect to time. The integrator reduces the effect of transient voltage spikes appearing at its input. A spike may have an amplitude comparable to the amplitude of the input signal, but the duration will generally be much shorter than the period of the input signal. Thus, the integrated value of the transient spike with respect to time is small, and contributes negligibly to the value of the integrator output voltage.

The integrator also acts to provide a relatively constant signal level when the input signal is generated by such means as a magnetic recording tape where changes in magnetic flux generate an electrical signal. The signal voltage in such a case is proportional to the rate of change of the flux, and thus will change in level as the speed of the tape, and hence the rate of change of the flux, is altered. If tape speed is increased or decreased, however, the increase or decrease in signal level will be accompanied by a concurrent decrease or increase, respectively, in the duration of the sensed input signal. Thus, the integrated output voltage, which is a function of both time and input level, will remain relatively constant, despite the change in tape speed.

A further function of the integrator is to introduce a −90° phase shift to the input signal so that a peak of the input signal creates a zero crossing at the integrator output for detection by the zero-crossing detection circuit 84.

Figure 3:
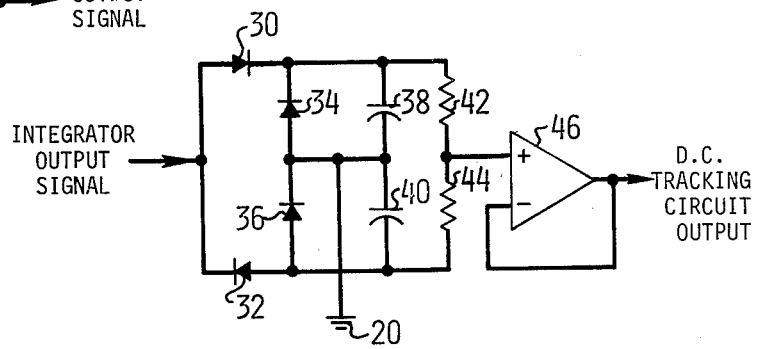
FIG. 3 is a detailed schematic diagram of the D.C. tracking circuit of FIG. 1.

Referring now to FIG. 3, there is shown a detailed schematic diagram of the D.C. tracking circuit 82 of FIG. 1. The output of the integrator 80 is connected to the anode of a germanium diode 30. The output of the integrator 80 is also connected to the cathode of a germanium diode 32. The cathode of diode 30 is connected to the cathode of a germanium diode 34 and to one lead of a capacitor 38. The anode of diode 34 and the other lead of capacitor 38 are both connected to the ground reference 20. The cathode of diode 30 is further connected through a resistor 42 to the non-inverting input of an operational amplifier 46.

The anode of diode 32 is connected to the anode of a germanium diode 36 and to one lead of a capacitor 40. The cathode of diode 36 and the other lead of capacitor 40 are connected to the ground reference 20. The anode of diode 32 is further connected through a resistor 44 to the non-inverting input of operational amplifier 46. The value of capacitor 38 is equal to the value of capacitor 40, and the value of resistor 42 is equal to the value of resistor 44. The inverting input and the output of amplifier 46 are directly connected so that amplifier 46 acts as a unity voltage gain amplifier with a high input impedance and low output impedance.

Positive portions of the signal at the output of the integrator 80 are sampled by diode 30 in conjunction with capacitor 38 and resistor 42. Negative portions of the integrator output signal are sampled by diode 32 in conjunction with capacitor 40 and resistor 44. A positive output from the integrator 80 causes diode 30 to conduct, and to thus allow a current flow that positively charges capacitor 38. Negative portions of the integrator output signal cause diode 32 to conduct and allow capacitor 40 to charge negatively. Resistors 42 and 44 act as a summing junction to algebraically sum the voltages appearing across capacitors 38 and 40 and to produce a dynamically changing level that tracks the D.C. component and any low frequency noise component of the integrator output signal. When diode 30 or diode 32 is not conducting, the associated capacitor, either capacitor 38 or capacitor 40, respectively, discharges through resistors 42 and 44 and diodes 34 and 36, and tends to return the voltage appearing at the input to amplifier 46 to zero volts. This discharge occurs at a rate sufficient to allow capacitor 38 and capacitor 40 to detect changes in amplitude of consecutive positive or consecutive negative portions of the integrator output waveform and properly sample these new values. The use of germanium diodes for diodes 30 and 32 also aids in accurately sampling changes in the positive and negative portions of the integrator signal due to the fact that the low voltage of 0.1 to 0.3 volts at which the diodes will conduct allows sampling of the waveform even when the magnitude of the signal is small. Diodes 34 and 36 conduct near zero volts to keep capacitor 38 from charging negatively when the input signal is predominantly negative, and to keep capacitor 40 from charging positively when the input signal is predominantly positive. Minimal phase shift of signal occurs between the input and the output of the D.C. tracking circuit 82.

Figure 4:
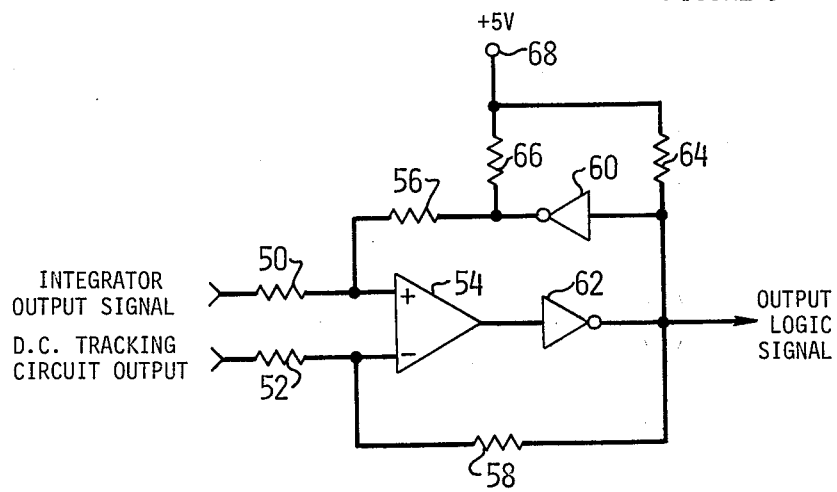
FIG. 4 is a detailed schematic diagram of the zero-crossing detector circuit of FIG. 1.

Referring finally to FIG. 4, there is shown a detailed schematic diagram of the zero-crossing detection circuit 84 of FIG. 1. The output of the integrator 80 is connected through a resistor 50 to the non-inverting input of a comparator 54. The output of the D.C. tracking circuit 82 is connected through a resistor 52 to the inverting input of comparator 54. The output of comparator 54 is connected to the input of a logic inverter 62. The output of inverter 62 is connected through a resistor 58 to the inverting input of comparator 54, and is also connected to a 5-volt supply 68 through a resistor 64. The output of inverter 62 is further connected to the input of a second logic inverter 60. The output of inverter 60 is connected through a resistor 66 to the 5-volt supply 68 and is further connected through a resistor 56 to the non-inverting input of comparator 54.

The values of resistors 66, 56, and 50 are selected so that the voltage division across these resistors from the 5-volt supply 68 produces a D.C. feedback voltage of approximately +0.45 volts at the non-inverting input to comparator 54 when the output of the inverter 60 is high. When the output of inverter 60 is low, the D.C. feedback voltage appearing at the non-inverting input of comparator 54 is 0 volts. Similarly, due to the selection of the values of resistors 64, 58, and 52, the D.C. feedback voltage appearing at the inverting input to comparator 54 due to the voltage division of the 5-volt supply 68 across resistors 64, 58, and 52 is approximately +0.45 volts when the output of inverter 62 is high. When the output of inverter 62 is low, the D.C. feedback voltage at the inverting input to comparator 54 is 0 volts.

The output of inverter 62 serves as the output logic signal 86 from the zero-crossing detection circuit 84. This output will be 0 volts when the voltage at the non-inverting input to comparator 54 is relatively more positive than the voltage appearing at the inverting input of comparator 54. The level of the output logic signal 86 from the zero-crossing detection circuit will be approximately +4.5 volts due to the voltage division of resistor 64 and resistors 58 and 52 when the voltage appearing at the non-inverting input of comparator 54 is relatively more negative than the voltage appearing at the inverting input of comparator 54. The output of inverter 60 may provide an output logic signal complementary to the output logic signal 86 produced by the output of inverter 62.

If the output of comparator 54 is initially low, the output of inverter 62 will be high, the output of inverter 60 will be low, the D.C. feedback voltage at the inverting input to comparator 54 will be +0.45 volts, and the D.C. feedback voltage at the non-inverting input to comparator 54 will be 0 volts. As signals are received directly from the integrator 80 and from the D.C. tracking circuit 82, the output of comparator 54 will not change state until the output of integrator 80 exceeds the output of the D.C. tracking circuit 82 by +0.45 volts. The output of comparator 54 will then switch high, the output of inverter 62 will go low to 0 volts, the output of inverter 60 will go high to approximately +4.5 volts, the D.C. feedback voltage at the non-inverting input of comparator 54 will be +0.45 volts, and the D.C. feedback voltage at the inverting input of comparator 54 will be 0 volts. The output of comparator 54 will not return low until the output signal of integrator 80 is 0.45 volts more negative than the output of the D.C. tracking circuit 82. Thus, there is a 0.9-volt difference between the point where a positive-going zero crossing of the integrator output signal is detected and the point where a negative-going zero crossing of the integrator output signal is detected. This 0.9-volt hysteresis improves noise rejection of the peak detector by ignoring small variations around a zero-volt difference between the integrator and D.C. tracking circuit outputs, and by preventing double switching due to noise or small variations in either the integrator or D.C. tracking circuit output when the relationship between the two signals is such that a zero crossing is detected. The hysteresis voltage can be varied by changing the ratios of resistors 50, 56, and 66, and the ratios of resistors 52, 58, and 64.

We claim:

1. A peak detector circuit for indicating the occurrence of a peak of an alternating input signal, the circuit comprising:

an integrator for receiving the alternating input signal and for providing an alternating integrated signal having a phase shift of 90° with respect to said alternating input signal;

D.C. tracking means coupled to said integrator for receiving the alternating integrated signal, for sampling every consecutive pair of peaks of said alternating integrated signal, and for providing a reference level signal that is proportional to the mean value of the algebraic sum of the most recently sampled pair of peaks of said alternating integrated signal; and zero-crossing detection means coupled to said integrator and said D.C. tracking means for receiving said alternating integrated signal and said reference level signal, and for issuing a logic signal at each point in time wherein said reference level signal and said alternating integrated signal are in a predetermined voltage relationship that establishes a selected level of hysteresis.

2. A peak detector circuit as in claim 1 wherein the zero-crossing detection means comprises:

a voltage comparator for receiving first and second input voltage levels and for producing an output logic level indicating which of said first and second input voltage levels is relatively more positive;

first feedback means for supplying a D.C. voltage related to the output logic level of said voltage comparator and for summing said D.C. voltage with the alternating integrated signal from said integrator to generate said first input voltage level; and second feedback means for supplying a D.C. voltage related to the output logic level of said voltage comparator and for summing said D.C. voltage with the reference level signal from said D.C. tracking means to generate said second input voltage level.

* * * * *